(12) United States Patent
Singh et al.

(10) Patent No.: US 11,908,784 B2
(45) Date of Patent: Feb. 20, 2024

(54) PACKAGED SEMICONDUCTOR DEVICE ASSEMBLY

(71) Applicant: NXP USA, Inc., Austin, TX (US)

(72) Inventors: Akhilesh Kumar Singh, Austin, TX (US); Andrew Jefferson Mawer, Austin, TX (US); Nishant Lakhera, Austin, TX (US); Chee Seng Foong, Austin, TX (US); Nihaar N. Mahatme, Austin, TX (US)

(73) Assignee: NXP USA, Inc., Austin, TX (US)

( * ) Notice: Subject to any disclaimer, the term of this patent is extended or adjusted under 35 U.S.C. 154(b) by 41 days.

(21) Appl. No.: 17/029,680

(22) Filed: Sep. 23, 2020

(65) Prior Publication Data

US 2022/0093499 A1 Mar. 24, 2022

(51) Int. Cl.
  *H01L 23/498* (2006.01)
  *H01L 23/00* (2006.01)
  *H01L 21/52* (2006.01)

(52) U.S. Cl.
  CPC ........ *H01L 23/49833* (2013.01); *H01L 21/52* (2013.01); *H01L 23/49811* (2013.01); *H01L 24/73* (2013.01); *H01L 2224/73265* (2013.01)

(58) Field of Classification Search
  CPC ........ H01L 23/49833; H01L 23/49811; H01L 23/5383
  See application file for complete search history.

(56) References Cited

U.S. PATENT DOCUMENTS

| | | | |
|---|---|---|---|
| 6,593,220 B1 | 7/2003 | Yu et al. | |
| 8,413,321 B2 * | 4/2013 | Brunner | H01L 23/49894 29/830 |
| 8,471,376 B1 * | 6/2013 | Liou | H01L 25/0657 257/E21.705 |
| 8,788,741 B2 | 7/2014 | Kwon et al. | |
| 9,064,858 B2 * | 6/2015 | Pendse | H01L 23/49811 |
| 9,245,770 B2 * | 1/2016 | Kim | H01L 21/56 |
| 9,651,751 B1 * | 5/2017 | Ding | H01S 5/02345 |
| 9,755,335 B2 | 9/2017 | Rathburn | |
| 2006/0220244 A1 * | 10/2006 | Lu | H01L 24/16 257/738 |
| 2006/0228878 A1 | 10/2006 | Park et al. | |

(Continued)

FOREIGN PATENT DOCUMENTS

JP 2011205018 A1 * 10/2011
WO PCT-WO2016178000 A1 11/2016

*Primary Examiner* — Michele Fan

(57) ABSTRACT

A semiconductor device comprises a substrate including a set of interconnect pads, a die mounted on the substrate, wherein the die includes circuitry that cannot withstand typical lead-free (Pb-free) solder reflow temperature during reflow process, and a reinforcing interposer including a first set of interconnect pads and a second set of interconnect pads. Low temperature solder material connects one of the set of interconnect pads on the substrate to a corresponding one of the first set of interconnect pads on the reinforcing interposer. A printed circuit board includes a set of interconnect pads. Low temperature solder material connects one of the set of interconnect pads of the printed circuit board to a corresponding one of the second set of interconnect pads of the reinforcing interposer. The low temperature solder material has a reflow temperature below typical Pb-free solder material.

20 Claims, 4 Drawing Sheets

(56) References Cited

U.S. PATENT DOCUMENTS

| | | | |
|---|---|---|---|
| 2010/0032834 A1* | 2/2010 | Vanalli | H01L 23/49827 |
| | | | 257/E21.585 |
| 2010/0148316 A1* | 6/2010 | Kim | H01L 24/19 |
| | | | 438/109 |
| 2012/0313190 A1* | 12/2012 | Goel | B81C 1/00333 |
| | | | 257/416 |
| 2014/0233897 A1* | 8/2014 | Ishikawa | G02B 6/4292 |
| | | | 385/93 |
| 2015/0116970 A1* | 4/2015 | Kishi | H01L 24/73 |
| | | | 361/773 |
| 2018/0182443 A1* | 6/2018 | Chia | H01L 43/08 |
| 2019/0103541 A1* | 4/2019 | Abraham | H01L 24/81 |
| 2019/0355667 A1* | 11/2019 | Kwon | H01L 23/5389 |
| 2020/0161252 A1* | 5/2020 | Yang | H01L 23/552 |

\* cited by examiner

PACKAGED SEMICONDUCTOR DEVICE ASSEMBLY

BACKGROUND

Field

This disclosure relates generally to packaged devices, and more specifically, to a packaged device assembly.

Related Art

Surface mount technology (SMT) refers to the methods in which packaged devices are attached to the surface of a printed circuit board (PCB). Reflow soldering is a commonly used process for attaching a packaged device to a PCB. During the solder reflow, the packaged semiconductor device and PCB are subjected to heat at solder reflow temperatures, which are typically greater than 235 degrees Celsius, to create the solder joints. This heat erases data stored in temperature sensitive circuits, such as magnetoresistive random access memories (MRAMs). While low temperature solder materials are available which can be reflowed at lower temperatures, the resulting solder joints are not reliable due, for example, to fractures at the interfaces between the reflowed solder joint (e.g. solder ball) and metal pads on the packaged semiconductor device and PCB, and fractures within the solder joint itself. Therefore, a need exists for improved SMT which allows for the reliable attachment of a packaged semiconductor device to a PCB without exposing the packaged semiconductor device to damaging high reflow temperatures.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a reinforcing interposer is used to join a packaged semiconductor device to a printed circuit board (PCB). The packaged semiconductor device includes exposed interconnect pads on a bottom surface of the packaged device. The interposer has a top surface (also referred to as a first major surface) and a bottom surface (also referred to as a second major surface, which is opposite the first major surface). At each of the top and bottom surfaces, the reinforcing interposer includes conductive pads, an adhesive layer which exposes the conductive pads, and preformed low-temperature solder material on each of the conductive pads. The PCB includes exposed interconnect pads on a top surface of the PCB. A device assembly is formed in which the reinforcing interposer is stacked between the packaged semiconductor device and the PCB, such that an adhesive layer is located between the bottom surface of the packaged device and the top surface of the reinforcing interposer, and an adhesive layer is located between the bottom surface of the reinforcing interposer and the top surface of the PCB. The device assembly is then reflowed at a temperature of less than 200 degrees Celsius to form reliable solder joints between the packaged semiconductor device and the reinforcing interposer and between the reinforcing interposer and the PCB.

Figure 1:
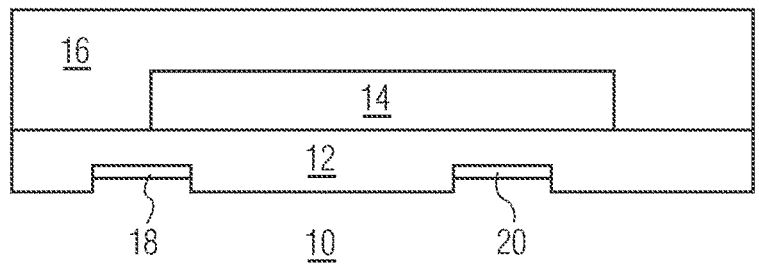
FIG. 1 illustrates a cross-sectional view of an example of a packaged semiconductor device.

FIG. 1 illustrates a cross-sectional view of one example of a packaged semiconductor device 10 (also referred to as a packaged semiconductor product or a packaged device). Packaged device 10 incudes a semiconductor die 14 mounted on a first major surface (i.e. top surface) of package substrate 12. Device 14 can be a flip chip die mounted on substrate 12 or a wire bond device attached and connected to substrate 12. An encapsulant 16 surrounds die 14 (and the wire bonds, if present). A bottom major surface (i.e. bottom surface) of substrate 12 includes a set of interconnect pads, including interconnect pads 18 and 20. These interconnect pads include a conductive material and provide electrical connections via interconnect layers of substrate 12 to die 14 (by way, for example, of solder bumps, wire bonds, etc.). As will be discussed further below, packaged device 10 can be any type of packaged device having interconnect pads, such as interconnect pads 18 and 20, which allow connections with the die. For example, it can also be a quad flatpack no lead (QFN) packaged device.

Figure 2:
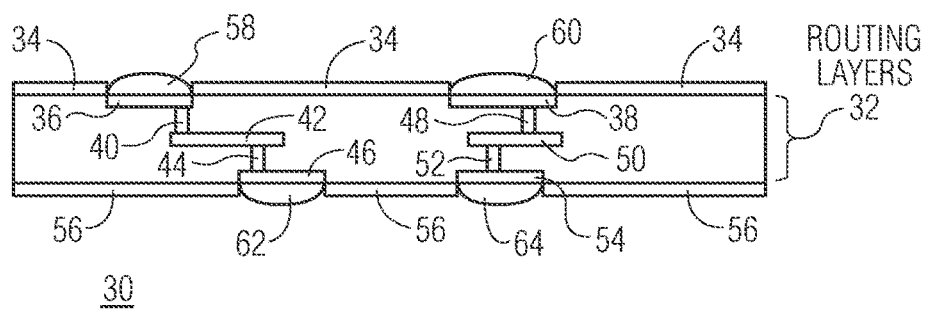
FIG. 2 illustrates a cross-sectional view of a reinforcing interposer in accordance with one embodiment of the present invention.

FIG. 2 illustrates a cross-sectional view of a reinforcing interposer (RI) 30. RI 30 includes one or more routing layers 32, an adhesive layer 34 on a first major surface (i.e. top surface) of RI 30, and an adhesive layer 56 on a second major surface (i.e. bottom surface) of RI 30, opposite the first major surface. The first major surface includes a set of interconnect pads (i.e. conductive pads), including pads 36 and 38, and the second major surface includes a set of conductive pads, including pads 46 and 54. RI 30 also includes one or more routing layers which include conductive material to route signals through RI 30 between the set of pads on the first major surface and the set of pads on the second major surface. For example, RI 30 includes intralayer conductors 42 and 50, and interlayer conductors (e.g. conductive vias) 40, 44, 38, 52. Conductors 40, 42, and 44 transmit electrical signals between conductive pad 36 and conductive pad 46, and conductors 48, 50, and 52 transmit electrical signals between conductive pad 38 and conductive pad 54. The insulating material 66 surrounding the conductive material in RI 30 can be any type of insulating or dielectric material. Routing layers 32 may include any number (one or more) layers, in which each layer may include a set of intralayer conductors (which route signals within the same layer) and a set of interlayer conductors (which route signals between layers).

RI 30 also includes preformed low temperature solder on each of the interconnect pads on the major surfaces of RI 30, e.g. preformed low temperature solder 58 on conductive pad 36, preformed low temperature solder 60 on conductive pad 38, preformed low temperature solder 62 on conductive pad 46, and preformed low temperature solder 64 on conductive pad 54. Low temperature solder refers to a solder (e.g. a metal alloy) which melts at lower temperatures as compared to conventional lead free (Pb-free) solder alloys (e.g. a tin-silver-copper (SnAgCu) alloy with 3% silver and 0.5% copper), so that solder reflows can be performed at less than 200 degrees C., or even at temperatures less than 170 degrees C. Examples of low temperature solders include tin/bismuth alloys (e.g. Sn/Bi with 58% bismuth), tin/bismuth/silver alloys (e.g. Sn/Bi/Ag with 57% bismuth and 1% silver), and tin/indium alloys (e.g. Sn/In with 52% indium). Typically, the peak reflow temperatures provided by Sn/Bi alloys are in a range of 160-170 degrees C., as compared to the peak reflow temperatures of Sn/Pb alloys which may be in a range of 210 to 220 degrees C. In some embodiments, the low temperature solder may also include some dopants. In one embodiment, one or both of adhesive layers 34 and 56 may be a pressure sensitive adhesive.

Figure 3:
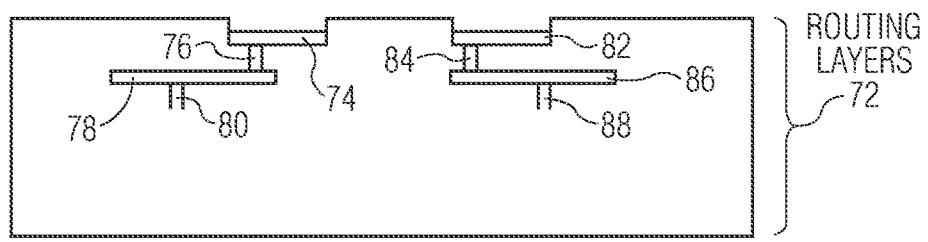
FIG. 3 illustrates a cross-sectional view of an example of a PCB.

FIG. 3 illustrates a cross-sectional view of one example of a PCB 70. PCB 70 includes a set of interconnect pads (i.e. conductive pads), including pads 74 and 82, on a first major surface (i.e. top surface), and one or more routing layers 72. Routing layers 72 include conductive material to route signals throughout PCB 70, such as between devices mounted onto the top surface of PCB 70 or to power busses. For example, routing layers 72 include intralayer conductors 78 and 86, and interlayer conductors (e.g. conductive vias) 76, 80, 84, and 88. The insulating material 90 surrounding the conductive material in PCB 70 can be any type of insulating or dielectric material. Routing layers 72 may include any number (one or more) layers, in which each layer may include a set of intralayer conductors (which route signals within the same layer) and a set of interlayer conductors (which route signals between layers).

Figure 4:
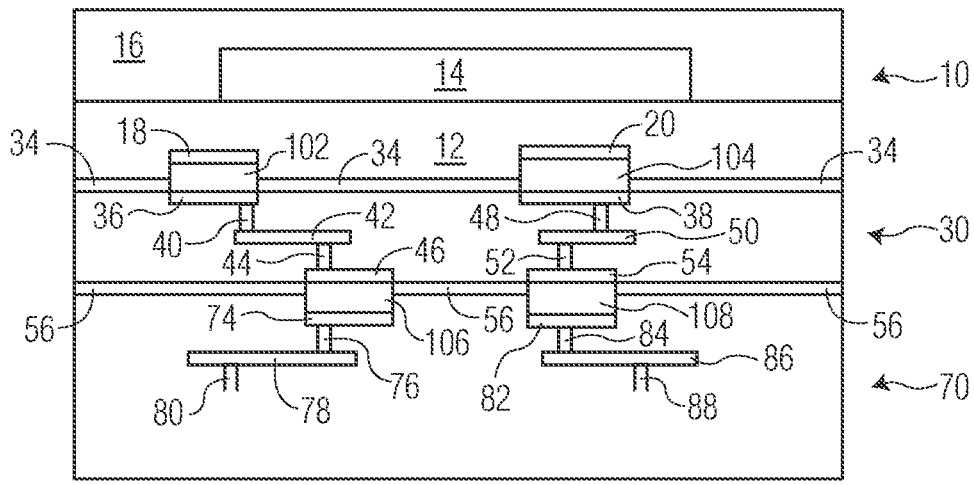
FIG. 4 illustrates an assembly in accordance with one embodiment of the present invention.
Figure 5:
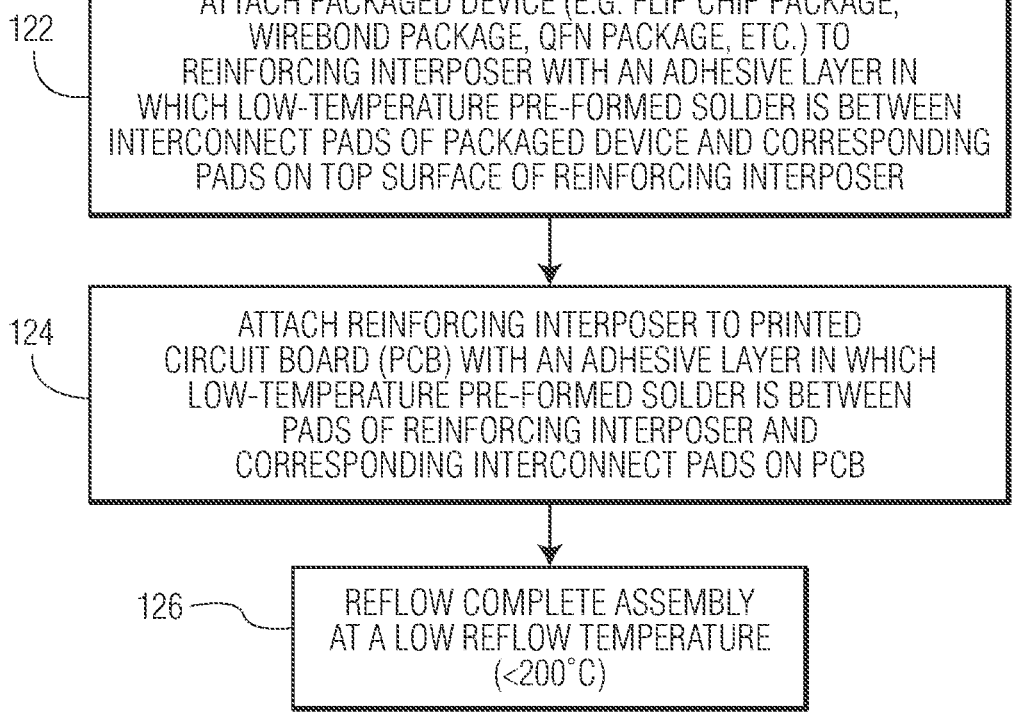
FIGS. 5 and 6 illustrate, in flow diagram form, methods for making the assembly of FIG. 4, in accordance with embodiments of the present invention.

FIG. 4 illustrates an assembly 100 (which may also be referred to overall as a semiconductor device) formed using packaged device 10, RI 30, and PCB 70, in which formation of assembly 100 will be further described in reference to the flow diagram of FIG. 5. Packaged device 10 is attached to RI 30 (e.g. block 122 of FIG. 5) using adhesive 34 between packaged device 10 and RI 30, and RI 30 is attached to PCB 70 (e.g. block 124 of FIG. 5) using adhesive 56 between RI 30 and PCB 70.

Note that the interconnect pads on the bottom surface of packaged device 10 align to those on the top surface of RI 30, and the interconnect pads on the bottom surface of RI 30 align to those on the top surface of PCB 70. In this manner, when packaged device 10 is stacked onto RI 30, the preformed low temperature solder on the pads on the top surface of RI 30 are in contact with a corresponding pad on the bottom surface of packaged device 10. For example, upon attaching packaged device 10 to RI 30, preformed low temperature solder 58 is between pad 18 and pad 36, and preformed low temperature solder 60 is between pad 20 and pad 38. Similarly, when RI 30 is stacked onto PCB 70, the preformed low temperature solder on the pads on the bottom surface of RI 30 are in contact with a corresponding pad on the top surface of PCB 70. For example, upon attaching RI 30 to PCB 70, preformed low temperature solder 62 is between pad 46 and pad 74, and preformed low temperature solder 64 is between pad 54 and pad 82.

To complete assembly 100 of FIG. 4, after stacking packaged device 10, RI 30, and PCB 70, the complete assembly is reflowed at a low reflow temperature of less than 200 degrees C. (e.g. block 126 of FIG. 5). The reflow melts the low temperature solder, resulting in permanent solder joints 102 and 104 between packaged device 10 and RI 30, and permanent solder joints 106 and 108 between RI 30 and PCB 70. Due to the lower temperature used for the reflow as compared to typical reflows used for SMT, information stored in the die of packaged die 10 which is sensitive to temperature (e.g. MRAMs) are not lost or corrupted during solder reflow. In one embodiment, the reflow temperature is in a range of 130 to 200 degrees C. Alternatively, the reflow temperature is less than 170 degrees C.

Figure 6:
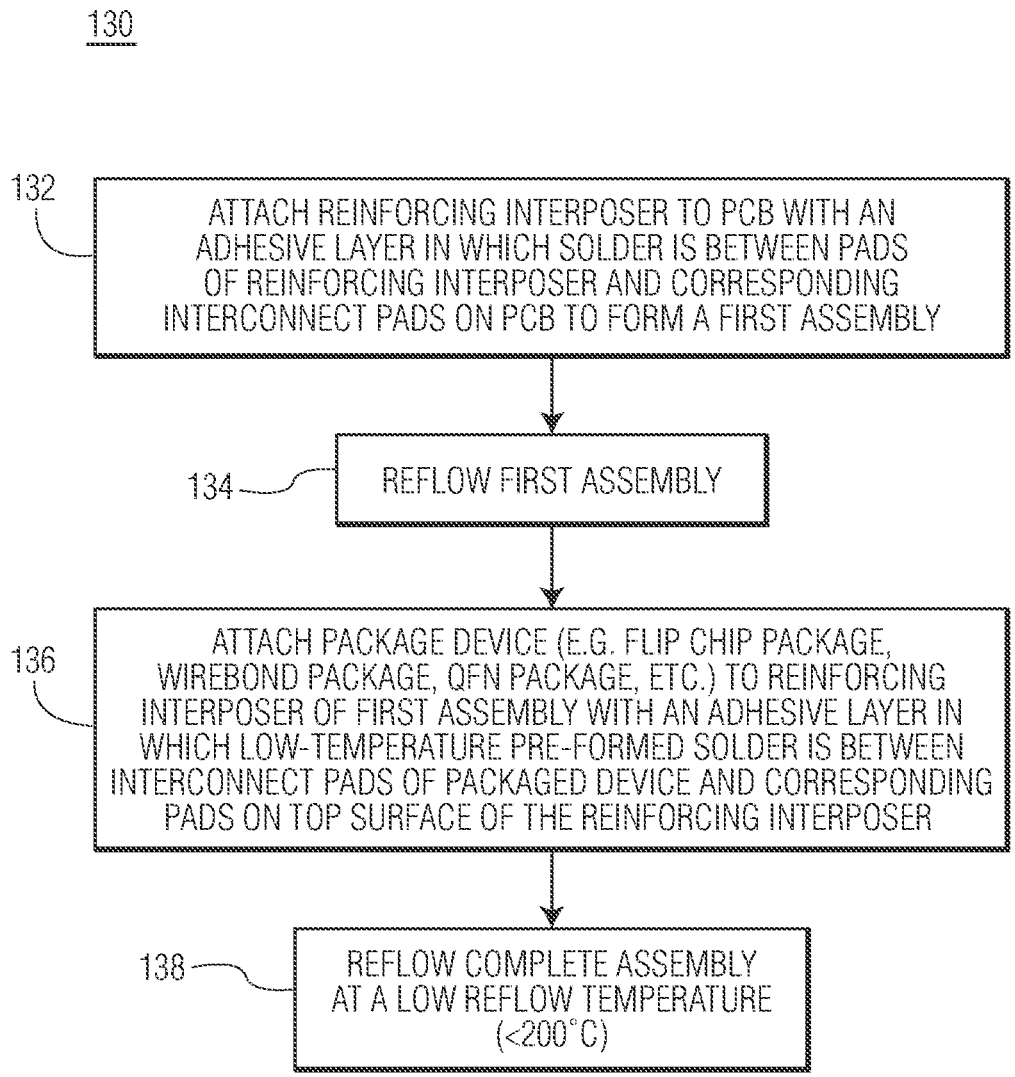

FIG. 6 illustrates, in flow diagram form, a method 130 for forming assembly 100 of FIG. 4, in accordance with an alternate embodiment of the present invention. Method 130 begins with block 132 in which RI 30 is first stacked onto PCB 70 to form a first assembly, in which the pads on the bottom surface of RI 30 are aligned with a corresponding pad on the top surface of PCB 70. In one example, preformed low-temperature solder 62 is between pad 46 and pad 74, and preformed low-temperature solder 64 is between pad 54 and pad 82. In another example, standard Pb-free alloys may be used between the pads of RI 30 and PCB 70 rather than the low-temperature solders. Then, at block 134, the first assembly is reflowed. If low-temperature solder is used to attach RI 30 to PCB 70, then a low temperature reflow is performed (e.g. at a temperature of less than 200 degrees C.). If standard Pb-free solder is used, a standard reflow can be performed (e.g. at a temperature of greater than 235 degrees C.). The first assembly may be done first, for example, by a customer, in which only the packaged devices are provided to the customer.

At block 136, packaged device 10 is then attached to RI 30 of the first assembly using adhesive 34 between packaged device 10 and RI 30. The interconnect pads on the bottom surface of packaged device 10 align to those on the top surface of RI 30 such that the preformed low temperature solder on the pads on the top surface of RI 30 are in contact with a corresponding pad on the bottom surface of packaged device 10. For example, upon attaching packaged device 10 to RI 30, preformed low temperature solder 58 is between pad 18 and pad 36, and preformed low temperature solder 60 is between pad 20 and pad 38.

After stacking packaged device 10 onto the first assembly, the complete assembly is reflowed (block 138) at a low reflow temperature of less than 200 degrees C. The reflow melts the low temperature solder, resulting in permanent solder joints 102 and 104 between packaged device 10 and RI 30. Due to the lower temperature used for the reflow on the complete assembly as compared to typical reflows used for SMT, information stored in the die of packaged die 10 which is sensitive to temperature (e.g. MRAMs) are not lost or corrupted during solder reflow. In one embodiment, the reflow temperature is in a range of 130 to 200 degrees C. Alternatively, the reflow temperature is less than 170 degrees C.

With either embodiment, RI 30 operates to reduce the stresses on the low temperature solder during attachment and subsequent reflows. That is, the stress load during formation of assembly 100 is shared by packaged device 10 and RI 30. RI 30 also helps to reduce stress on solder joints during application (by reducing stress on solder joints). In one embodiment, the materials of routing layers 32 are designed to match those of routing layers 72 to better match the stresses. For example, in one embodiment, each routing layer of PCB 70 and RI 30 is a laminate layer. Also, in one embodiment, a package substrate of packaged device 10 (e.g. package substrate 12) also uses the same materials as routing layers 32, to better match stresses for the stacking within assembly 100.

Note that the use of RI 30 with the adhesives between packaged device 10 and PCB 70 removes the need to form solder balls directly between the pads of package device 10 and PCB 70. That is, without RI 30, packaged device 10 would be mounted by way of solder balls directly onto PCB 70. However, the resulting solder balls created using low temperature solders are more brittle than regular solders (which are typically reflowed at greater than 235 degrees C.), resulting in fractures at the interfaces between the metal pads and the solder ball, or within the solder ball itself. Therefore, through the use of RI 30, an improved assembly can be achieved which can be reflowed at lower temperatures to protect temperature sensitive circuitry while still resulting in strong solder joints between the packaged device and the RI, and between the RI and the PCB.

Note that the set of interconnect pads on the top surface of RI 30 and those at the bottom surface of RI 30 may have different layout or positioning patterns, in which the pads on the top surface may or may not align to a corresponding pad on the bottom surface. Referring to FIG. 2, note that pad 38 aligns with pad 64 (i.e. there is overlap of the two pads when viewed along a vertical line perpendicular to the top and bottom major surfaces of RI 30), and pad 36 does not align with pad 46 (i.e. there is no overlap of the two pads when viewed along any vertical line through either pad perpendicular to the top and bottom major surfaces of RI 30). In the case of aligned pads between the top and bottom major surfaces of RI, note that a single continuous conductive via can connect the two. Therefore, RI 30 also helps create a layout interface between packaged device 10 and PCB 70. For example, the pads at the top surface of RI 30 can be laid out to match the positioning of interconnect pads on the bottom surface of packaged device 10, while the pads on the bottom surface of RI 30 can be laid out to match the positioning of pads at the top surface of PCB 70. This way, the layout of the pads on the bottom surface of packaged device 10 need not match the layout of the pads on the top surface of PCB 70.

Figure 7:
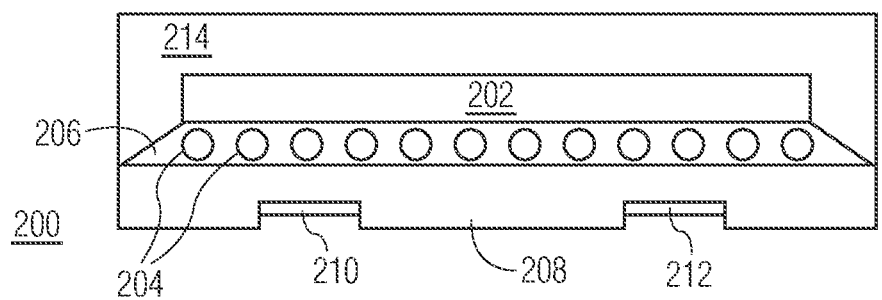
FIGS. 7-9 illustrate various examples of packaged semiconductor devices which can be used in the assembly of FIG. 4.
Figure 8:
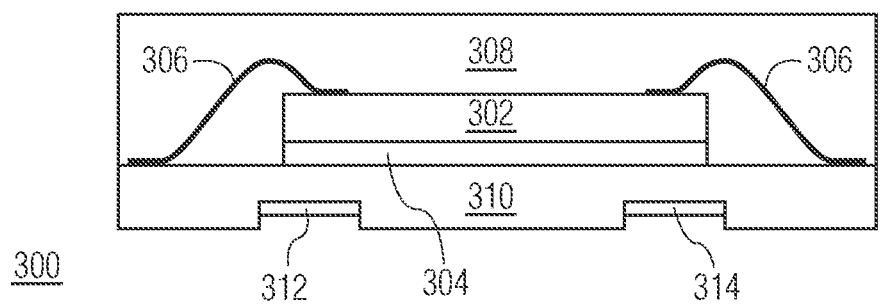
Figure 9:
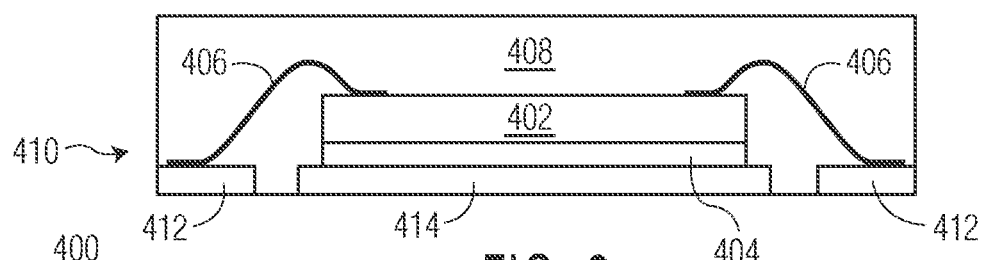

Referring to block 122 of FIG. 5 and block 132 of FIG. 6, note that packaged device 10 can be any type of packaged device, such as a flip chip package, wirebond package, QFN package, etc. FIGS. 7-9 illustrate examples of these various types of packaged devices which may each be used in place of packaged device 10. FIG. 7 illustrates a flip chip packaged device 200 which includes a die 202 mounted and connected to a package substrate 208 by way of solder bumps 204. Solder bumps 204 are surrounding by an underfill material 206, and die 202 and underfill 205 are surrounded by an encapsulant 214 (i.e. mold compound). Packaged device 200 may have a lid over die 202, or no lid over die 202 (i.e. an exposed die), and be encapsulated in mold compound. At a bottom major surface of packaged device 200 (i.e. of package substrate 208 of packaged device 200), there is a set of interconnect pads 210 and 212, which may be used to align to pads of an RI, such as RI 30.

FIG. 8 illustrates a wire bond packaged device 300 which includes a die 302 mounted to a package substrate 310 with an adhesive 304 (or a die attach material). Wire bonds 306 provide electrical connections between die 302 and package substrate 310. Die 302, adhesive 304, and wire bonds 306 are surrounded by an encapsulant 308. At a bottom major surface of packaged device 300 (i.e. of package substrate 310 of packaged device 300), there is a set of interconnect pads 312 and 314, which may be used to align to pads of an RI, such as RI 30. Note that package substrates 208 and 310 are analogous to package substrate 12 of FIG. 1, each of die 202 and 302 is analogous to die 14 of FIG. 1, and pads 210/212 and 312/314 are analogous to pads 18/20 of FIG. 1.

FIG. 9 illustrates a QFN packaged device 400 which includes a die 402 mounted to a flag portion 414 of a lead frame 410 with an adhesive 404. Wire bonds 406 provide electrical connections between die 402 and corresponding lead fingers 412 of lead frame 410. Die 402, adhesive 404, and portions of lead frame 410 are surrounded by an encapsulant 408. Die 402 may be analogous to die 14 of FIG. 1, and note that the exposed bottom portions of lead fingers 412 correspond to interconnect pads 18 and 20, in which lead fingers 412 are attached to RI 30 via the low temperature solder (e.g. solders 58 and 60 in FIG. 2).

Figure 10:
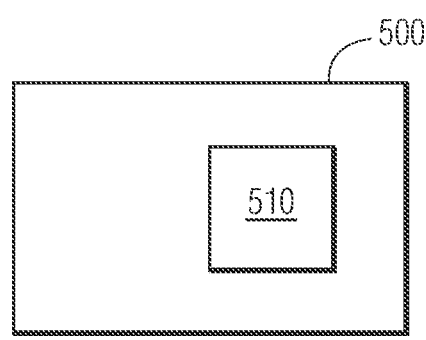
FIG. 10 illustrates, in block diagram form, a die which may be used in any of the packaged devices of FIG. 1, 4, 7, 8, or 9, in accordance with embodiments of the present invention.

FIG. 10 illustrates an embodiment of a semiconductor die 500 which may be used in any of packaged devices 10, 200, 300, of 400 above and thus be used in assembly 100. Die 500 includes temperature sensitive circuitry 510 for Pb-free reflow (e.g. MRAM). That is, temperature sensitive circuitry 510 is any circuitry which can be impacted by temperatures used in typical Pb-free reflow processes (e.g. greater than or equal to 235 degrees C.). For example, data or code programmed into MRAM can inadvertently be lost or corrupted (or memory cells of the MRAM can inadvertently change state) if exposed to temperatures greater than or equal to 235 degrees C. Therefore, by using RI 30 with the low-temperature solder, this data is not corrupted or lost by high reflow temperatures since high reflow temperatures are not needed to form the solder joints of the resulting assembly.

Therefore, by now it can be understood how a reinforcing interposer can be used to stack a packaged device to a PCB using low temperature solder, such that strong solder joints are created between the PCB and the reinforcing interposer, and between the packaged device and the reinforcing interposer without exposing the die of the packaged device to high reflow temperatures. That is, the resulting assembly of the packaged device, reinforcing interposer, and PCB is subsequently reflowed at a reflow temperature of less than 200 degrees C. to form the solder joints.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in one embodiment, each of the die illustrated herein can be any type of integrated circuit or die or system on a chip (SoC) having temperature sensitive circuitry, and any packaged device may include more than one die .

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, in one embodiment, the reinforcing substrate may be attached to the PCB prior to attaching the packaged device to the reinforcing substrate. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In an embodiment, a semiconductor device includes a substrate including a set of interconnect pads; a die mounted on the substrate, wherein the die includes circuitry that cannot withstand temperatures above a lead-free (Pb-free) solder reflow temperature during a solder reflow process; a reinforcing interposer including: a first set of interconnect pads, and a second set of interconnect pads; low temperature solder material connecting one of the set of interconnect pads on the substrate to a corresponding one of the first set of interconnect pads on the reinforcing interposer; a printed circuit board; a set of interconnect pads on the printed circuit board; low temperature solder material connecting one of the set of interconnect pads of the printed circuit board to a corresponding one of the second set of interconnect pads of the reinforcing interposer, wherein the low temperature solder material has a reflow temperature below the Pb-free solder reflow temperature. In one aspect, the die is mounted on the first major surface of the substrate using Pb-free solder material. In another aspect, the semiconductor device further includes wire bonds connected between the die and the substrate; and die attach material between the die and the substrate. In another aspect, the semiconductor device further includes a first adhesive layer between the substrate and the reinforcing interposer; and a second adhesive layer between the reinforcing interposer and the printed circuit board. In yet another aspect, the die is attached to a flag portion of a quad flat no-lead package; and wire bonds connect the die to corresponding interconnect pads in the substrate. In another aspect, the semiconductor device further includes one or more routing layers with conductive material connecting each of the first set of interconnect pads on the first major surface of the reinforcing interposer to a corresponding one of the second set of interconnect pad on the second major surface of the interposer.

In another embodiment, a method of making a semiconductor device includes attaching a packaged device to a reinforcing interposer with low temperature solder between interconnect pads of the packaged device and corresponding interconnect pads on a first surface of the reinforcing interposer; attaching the reinforcing interposer to a printed circuit board (PCB) with solder between interconnect pads on the PCB and interconnect pads on a second surface of the reinforcing interposer; after the attaching the packaged device to the reinforcing interposer, performing a reflow of at least the packaged device and the reinforcing interposer at a reflow temperature less than 200 degrees C. In one aspect of the another embodiment, the solder comprises low temperature solder, the attaching the packaged device to the reinforcing interposer and the attaching the reinforcing interposer to the PCB results in an assembly including the packaged device, the reinforcing interposer, and the PCB, and the performing the reflow at the reflow temperature less than 200 degrees C. is performed on the assembly. In another aspect, the attaching the reinforcing interposer to the PCB is performed prior to the attaching the packaged device to the reinforcing interposer and is performed at a temperature of at least 235 degrees C. In yet another aspect, the attaching the reinforcing interposer to the PCB is performed prior to the attaching the packaged device to the reinforcing interposer, and the method further includes: after attaching the reinforcing interposer to the PCB and prior to the attaching the packaged device to the reinforcing interposer, performing a reflow of the reinforcing interposer and the PCB.

In yet another embodiment, a semiconductor device includes a packaged semiconductor product including: a substrate, a die having a first major surface attached to a first major surface of the substrate, and interconnect pads formed on a second major surface of the substrate; a reinforcing interposer including: a first set of interconnect pads on a first major surface of the reinforcing interposer, a second set of interconnect pads on a second major surface of the reinforcing interposer, one or more routing layers, for each of the interconnect pads in the first and second sets of interconnect pads, conductive material extending through the one or more routing layers connecting one of the first set of interconnect pads on the first major surface of the reinforcing interposer to a corresponding one of the second set of interconnect pads on the second major surface of the reinforcing interposer; and for each of the interconnect pads on the substrate and each of the first set of interconnect pads on the reinforcing interposer, low temperature solder material connecting one of the interconnect pads on the substrate to a corresponding one of the first set of interconnect pads on the reinforcing interposer. In one aspect of the yet another embodiment, the semiconductor device further includes a printed circuit board; a first set of interconnect pads on a first major surface of the printed circuit board; and for each of the interconnect pads on the second major surface of the reinforcing interposer and the first set of interconnect pads on the first major surface of the printed circuit board, low temperature solder material connecting one of the first set of interconnect pads formed on the first major surface of the printed circuit board to a corresponding one of the second set of interconnect pads on the second major surface of the reinforcing interposer. In another aspect, the printed circuit board further includes one or more routing layers; and conductive material connected to at least some of the first set of interconnect pads on the first major surface of the printed circuit board and extending through the one or more routing layers of the printed circuit board. In yet another aspect, the first major surface of the die attached to the first major surface of the substrate using low temperature solder material. In another aspect, the semiconductor device further includes wire bonds connected between the die and the substrate; and die attach material between the first major surface of the die and the first major surface of the substrate. In another aspect, the semiconductor device further includes a first adhesive layer between the second major surface of the substrate and the first major surface of the reinforcing interposer; and a second adhesive layer between the second major surface of the reinforcing interposer and the first major surface of the printed circuit board. In yet another aspect, the die is attached to a flag portion of a quad flat no-lead package; and wire bonds connected between bond pads on a second major surface of the die and corresponding interconnect pads in the substrate. In another aspect, at least one of data and code is lost during a reflow process using temperatures above 235 degrees C. and the low temperature solder material has a reflow temperature below 200 degrees C. In another aspect, circuitry in the die includes magnetoresistive random access memory (MRAM); and at least one of data and code programmed in the MRAM is lost during a reflow process using temperatures above 235 degrees C. In a further aspect, the low temperature solder material has a reflow temperature below 200 degrees C.

What is claimed is:

1. A semiconductor device comprising:
    a packaged semiconductor product including:
        a package substrate,
        a die having a first major surface attached to a first major surface of the package substrate,
        electrical connections between the die and the first major surface of the package substrate,
        an encapsulant surrounding the die and the electrical connections, and
        interconnect pads formed on a second major surface of the package substrate;
    a reinforcing interposer including:
        a first set of interconnect pads on a first major surface of the reinforcing interposer,
        a second set of interconnect pads on a second major surface of the reinforcing interposer,
        one or more routing layers, and
        for each of the interconnect pads in the first and second sets of interconnect pads, conductive material extending through the one or more routing layers connecting one of the first set of interconnect pads on the first major surface of the reinforcing interposer to a corresponding one of the second set of interconnect pads on the second major surface of the reinforcing interposer;
    for each of the interconnect pads on the package substrate and each of the first set of interconnect pads on the reinforcing interposer, low temperature solder material connecting one of the interconnect pads on the package substrate to a corresponding one of the first set of interconnect pads on the reinforcing interposer;
    a printed circuit board;
    a first set of interconnect pads on a first major surface of the printed circuit board;
    for each of the interconnect pads on the second major surface of the reinforcing interposer and the first set of interconnect pads on the first major surface of the printed circuit board, low temperature solder material connecting one of the first set of interconnect pads formed on the first major surface of the printed circuit board to a corresponding one of the second set of interconnect pads on the second major surface of the reinforcing interposer, wherein the low temperature solder is in physical contact with both the one of the first set of interconnect pads and the corresponding one of the second set of interconnect pads;
    a first adhesive layer between the second major surface of the package substrate and the first major surface of the reinforcing interposer; and
    a second adhesive layer between the second major surface of the reinforcing interposer and the first major surface of the printed circuit board, wherein the second adhesive layer is in direct contact with the second major surface of the reinforcing interposer and in direct contact with the first major surface of the printed circuit board.

2. The semiconductor device of claim 1, wherein there are no devices between the second major surface of the reinforcing interposer and the first major surface of the printed circuit board.

3. The semiconductor device of claim 2, the printed circuit board further comprising:
    one or more routing layers; and
    conductive material connected to at least some of the first set of interconnect pads on the first major surface of the printed circuit board and extending through the one or more routing layers of the printed circuit board.

4. The semiconductor device of claim 1 wherein:
    the first major surface of the die is attached to the first major surface of the substrate using low temperature solder material.

5. The semiconductor device of claim 1 further comprising:
    wire bonds connected between the die and the package substrate; and
    die attach material between the first major surface of the die and the first major surface of the package substrate.

6. The semiconductor device of claim 1 where at least one of data and code is lost during a reflow process using temperatures above 235 degrees Celsius and the low temperature solder material has a reflow temperature below 200 degrees Celsius.

7. The semiconductor device of claim 1 wherein:
    circuitry in the die includes magnetoresistive random access memory (MRAM); and
    at least one of data and code programmed in the MRAM is lost during a reflow process using temperatures above 235 degrees Celsius.

8. The semiconductor device of claim 7 wherein the low temperature solder material has a reflow temperature below 200 degrees Celsius.

9. The semiconductor device of claim 1 wherein:
    the die is mounted on the first major surface of the package substrate with Pb-free solder material.

10. The semiconductor device of claim 1 wherein:
    the die includes circuitry that cannot withstand temperatures above a lead-free (Pb-free) solder reflow temperature during a solder reflow process.

11. The semiconductor device of claim 10, wherein:
    the low temperature solder material has a reflow temperature below the Pb-free solder reflow temperature.

12. The semiconductor device of claim 1 further comprising:
a first adhesive layer between the second major surface of the package substrate and the first major surface of the reinforcing interposer.

13. The semiconductor device of claim 1, wherein the electrical connections of the packaged semiconductor product further comprise wire bonds.

14. The semiconductor device of claim 1, wherein each of the first adhesive layer and the second adhesive layer is a pressure sensitive adhesive.

15. The semiconductor device of claim 1, wherein there are no devices between the second major surface of the reinforcing interposer and the first major surface of the printed circuit board.

16. A semiconductor device comprising:
a packaged semiconductor product including:
a package substrate,
a die having a first major surface attached to a first major surface of the package substrate,
electrical connections between the die and the first major surface of the package substrate,
an encapsulant surrounding the die and the electrical connections, and
interconnect pads formed on a second major surface of the package substrate;
a reinforcing interposer including:
a first set of interconnect pads on a first major surface of the reinforcing interposer,
a second set of interconnect pads on a second maj or surface of the reinforcing interposer,
one or more routing layers, and
for each of the interconnect pads in the first and second sets of interconnect pads, conductive material extending through the one or more routing layers connecting one of the first set of interconnect pads on the first major surface of the reinforcing interposer to a corresponding one of the second set of interconnect pads on the second maj or surface of the reinforcing interposer;
for each of the interconnect pads on the package substrate and each of the first set of interconnect pads on the reinforcing interposer, low temperature solder material connecting one of the interconnect pads on the package substrate to a corresponding one of the first set of interconnect pads on the reinforcing interposer
a printed circuit board;
a first set of interconnect pads on a first major surface of the printed circuit board;
for each of the interconnect pads on the second major surface of the reinforcing interposer and the first set of interconnect pads on the first major surface of the printed circuit board, low temperature solder material connecting one of the first set of interconnect pads formed on the first major surface of the printed circuit board to a corresponding one of the second set of interconnect pads on the second major surface of the reinforcing interposer;
a first adhesive layer between the second major surface of the package substrate and the first major surface of the reinforcing interposer; and
a second adhesive layer between the second major surface of the reinforcing interposer and the first major surface of the printed circuit board, wherein the second adhesive layer is in direct contact with the second major surface of the reinforcing interposer and in direct contact with the first major surface of the printed circuit board.

17. The semiconductor device of claim 16, wherein there are no devices between the second major surface of the reinforcing interposer and the first major surface of the printed circuit board.

18. The semiconductor device of claim 16, wherein each of the first adhesive layer and the second adhesive layer is a pressure sensitive adhesive.

19. The semiconductor device of claim 16 where at least one of data and code is lost during a reflow process using temperatures above 235 degrees Celsius and the low temperature solder material has a reflow temperature below 200 degrees Celsius.

20. The semiconductor device of claim 16 wherein:
circuitry in the die includes magnetoresistive random access memory (MRAM); and
at least one of data and code programmed in the MRAM is lost during a reflow process using temperatures above 235 degrees Celsius.

\* \* \* \* \*